United States Patent
Lazar et al.

(10) Patent No.: US 9,599,684 B2
(45) Date of Patent: Mar. 21, 2017

(54) MOUNTING FOR A BODY COIL OF A MAGNETIC RESONANCE DEVICE

(71) Applicants: Razvan Lazar, Erlangen (DE); Martin Schramm, Erlangen (DE)

(72) Inventors: Razvan Lazar, Erlangen (DE); Martin Schramm, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 555 days.

(21) Appl. No.: 14/203,180

(22) Filed: Mar. 10, 2014

(65) Prior Publication Data

US 2015/0002151 A1   Jan. 1, 2015

(30) Foreign Application Priority Data

Jun. 27, 2013   (DE) .................. 10 2013 212 458

(51) Int. Cl.
*G01R 33/34* (2006.01)
*G01R 33/28* (2006.01)
*G01R 33/00* (2006.01)

(52) U.S. Cl.
CPC ......... *G01R 33/34* (2013.01); *G01R 33/0052* (2013.01); *G01R 33/28* (2013.01); *G01R 33/34046* (2013.01); *Y10T 29/4902* (2015.01)

(58) Field of Classification Search
CPC ............... G01R 33/34; G01R 33/0052; G01R 33/34046; G01R 33/28; Y10T 29/4902
See application file for complete search history.

(56) References Cited

U.S. PATENT DOCUMENTS

| | | | | | |
|---|---|---|---|---|---|
| 4,560,933 | A | * | 12/1985 | Forster | G01R 33/3802 324/319 |
| 4,721,934 | A | * | 1/1988 | Stacy | F17C 3/085 174/15.4 |
| 4,920,316 | A | * | 4/1990 | Egloff | G01R 33/4215 324/318 |
| 6,842,005 | B2 | * | 1/2005 | Schuster | G01R 33/385 324/318 |
| 7,816,919 | B2 | * | 10/2010 | Yamashita | G01R 33/385 324/318 |

(Continued)

FOREIGN PATENT DOCUMENTS

| | | |
|---|---|---|
| DE | 10219767 A1 | 11/2003 |
| DE | 10245942 A1 | 4/2004 |

*Primary Examiner* — David Gray
*Assistant Examiner* — Laura Roth
(74) *Attorney, Agent, or Firm* — Lempia Summerfield Katz LLC

(57) ABSTRACT

Mounting for a body coil of a magnetic resonance device is provided. A reversible and universal mounting device for a body coil in the magnetic resonance device is provided. The mounting device includes at least one expanding ring for creating a way of retaining the body coil in a tunnel-shaped magnetic opening of the magnetic resonance device. The mounting device also includes at least one expander that is configured to enable the expanding ring to be mounted on the inside of the tunnel-shaped magnetic opening of the magnetic resonance device by spreading. The mounting device includes at least one mounting element for mechanically supporting the body coil on the expanding ring.

20 Claims, 2 Drawing Sheets

(56) References Cited

U.S. PATENT DOCUMENTS

| | | | |
|---|---|---|---|
| 8,106,736 B2* | 1/2012 | Calvert | G01R 33/3802 335/216 |
| 2004/0021467 A1 | 2/2004 | Eberler et al. | |
| 2004/0061499 A1 | 4/2004 | Stocker | |
| 2012/0068804 A1* | 3/2012 | Dunckley | G01R 33/3802 336/205 |
| 2014/0306702 A1* | 10/2014 | Lazar | G01R 33/34 324/307 |
| 2014/0306706 A1* | 10/2014 | Lazar | G01R 33/288 324/309 |
| 2015/0002154 A1* | 1/2015 | Lazar | G01R 33/34007 324/322 |

* cited by examiner

MOUNTING FOR A BODY COIL OF A MAGNETIC RESONANCE DEVICE

This application claims the benefit of DE 10 2013 212 458.9, filed on Jun. 27, 2013, which is hereby incorporated by reference in its entirety.

BACKGROUND

The present embodiments relate to mounting for a body coil of a magnetic resonance device.

A body coil is a component of a magnetic resonance device. The body coil is used for transmitting radiofrequency excitation pulses and receiving magnetic resonance signals. The body coil is to be mounted on the inside of a tunnel-shaped magnetic opening of the magnetic resonance device. With conventional body coil mounting devices, the body coil is mounted by screwing the body coil to threaded bolts that are welded to the front and back of the magnetic opening.

SUMMARY AND DESCRIPTION

The scope of the present invention is defined solely by the appended claims and is not affected to any degree by the statements within this summary.

The present embodiments may obviate one or more of the drawbacks or limitations in the related art. For example, reversible and universal mounting of a body coil is provided in a magnetic resonance device.

A mounting device for a body coil of a magnetic resonance device includes at least one expanding ring for creating a retainer for the body coil in a tunnel-shaped magnetic opening of the magnetic resonance device. The mounting device also includes at least one expander configured to enable the expanding ring to be mounted on the inside of the tunnel-shaped magnetic opening of the magnetic resonance device by spreading, and at least one mounting element for mechanically supporting the body coil on the expanding ring.

In the unspread state, the expanding ring has a smaller diameter than the tunnel-shaped magnetic opening of the magnetic resonance device. The spreading of the expanding ring causes the diameter of the expanding ring to increase. The expanding ring then adheres to the inside of the tunnel-shaped magnetic opening by static friction.

The mounting element of the expanding ring is matched to the outer side of the body coil or to a counterpart provided on the outer side of the body coil. This enables the mounting element of the expanding ring to interact with the outer side of the body coil or with the counterpart provided on the body coil. This produces stable mechanical support of the body coil, which is located inside the tunnel-shaped magnetic opening of the magnetic resonance device.

In contrast to conventional mounting devices, the mounting device for body coils of one or more of the present embodiments may be reversibly removed again from the inside of the tunnel-shaped magnetic opening After the expanding ring has returned to the unspread state and the removal of the expanding ring, no permanent changes to the magnetic resonance device remain. In contrast to the removal of conventional mounting devices for body coils, the expanding ring may be removed in the presence of a powerful magnetic field. For this purpose, special tools (e.g., non-magnetic tools) may be used. In addition, in contrast to conventional mounting devices for body coils, the expanding ring may be removed without welding work. This enables the expanding ring to be removed in rooms that do not permit spark- and chip-producing metalworking processes.

The mounting device for body coils is universal in that the mounting device allows body coils to be installed in the tunnel-shaped magnetic openings of any magnetic resonance devices. The diameter of the expanding ring in the spread state may be matched to the diameter of the respective tunnel-shaped magnetic opening. For example, for test purposes, the mounting device according to one or more of the present embodiments enables a body coil to be retrofitted to magnetic resonance devices that otherwise have no mounting facility for the body coil. This provides that a body coil may be installed in a magnetic resonance device of another manufacturer.

According to one embodiment, the expanding ring is at least partly made of plastic. The expanding ring may also consist completely of plastic. Glass-fiber reinforced plastic (e.g., Teflon or Kevlar) may be advantageously used. By using plastic as the material for the expanding ring, interference affecting the magnetic fields or RF waves in the magnetic resonance device is reduced or eliminated. The expanding ring may also be made of any other material (e.g., non-magnetic materials such as carbon fibers, hard paper, wood or aluminum).

In an advantageous embodiment, the expanding ring includes at least two ring segments. The number of ring segments is governed by the respective internal circumference of the tunnel-shaped magnetic opening. In normal magnetic resonance devices, the expanding ring may include approximately five ring segments. When linked together, the ring segments produce the complete circumference of the expanding ring.

According to another embodiment, the ring segments may be interconnected by pinned connections. This enables the ring segments to be of modular design yet securely fixed to one another.

Another embodiment provides that the expander, in an initial state, is configured such that the expanding ring has a first radius, and the expander, in a second state, is configured such that the expander enters into a changed interaction with the expanding ring. The expanding ring has an enlarged second radius compared to the first radius. The transition of the expander from a first state to a second state causes the ring to spread out. Operation of the expander enables the diameter of the expanding ring to be increased such that the expanding ring adheres to the inside of the tunnel-shaped magnetic opening of the magnetic resonance device by static friction. The expander may be removed from the tunnel-shaped magnetic opening after the expanding ring has been spread out. The expander is to be replaced by a locking element that keeps the expanding ring in the spread state. Alternatively, the expander may also remain in the tunnel-shaped magnetic opening after spreading and keep the expanding ring in the spread state.

According to another embodiment, the expander includes a guide lug that is incorporated in the expanding ring, and at least one expanding element and a connecting element cooperating therewith. The expanding element and the connecting element allow the expanding element to be displaced relative to the guide lug. Displacement of the expanding element in the direction of the guide lug may cause a ring segment of the expanding ring to be forced apart along the guide lug. This causes enlargement of the diameter of the expanding ring and therefore spreading-out of the expanding ring.

According to an embodiment, the mounting element is implemented as a support element. The support element includes a mount on an end facing the inside of the tunnel-shaped magnetic opening. The mount is configured to provide a mechanical connection between the support element and the expanding ring. The support element includes, at the end facing in the direction of the center of the tunnel-shaped magnetic opening, a ram adjustable in the radial direction for mechanically fixing the body coil. The body coil may be mechanically fixed in place by ram pressure against the outer wall of the body coil in the direction of the center of the tunnel-shaped magnetic opening.

According to another embodiment, the support element has an adjustable damper between the mount and the ram. By adjusting the damper, the pressure of the ram against the outer wall of the body coil may be regulated. The damper may therefore be configured such that, for the vibration of the body coil during magnetic resonance imaging, only frequencies that do not interact with the imaging frequencies in any way (e.g., the moiré effect) may occur.

An embodiment provides that the mounting element is implemented as a bottom support device for the body coil. The bottom support device is provided for mechanical connection to the expanding ring and has at least one point of support for the body coil. For example, the body coil may be mechanically supported on the expanding ring by a combination of support elements and a bottom support device. The weight of the body coil is then borne by the bottom support device, and the position of the body coil may be set by adjusting the support elements.

In one embodiment of a method for mounting a body coil in a magnetic resonance device, the body coil is mounted on the inside of the tunnel-shaped magnetic opening of the magnetic resonance device by at least one expanding ring such that the expanding ring, by being spread out by at least one expander, is mounted on the inside of the tunnel-shaped magnetic opening of the magnetic resonance device, and the body coil is mechanically supported on the expanding ring by at least one mounting element. The expanding ring may be installed in the tunnel-shaped magnetic opening by pinning together a plurality of ring segments. Mounting elements may be incorporated between the ring segments during installation of the expanding ring. The expander may already be incorporated in a ring segment of the expanding ring, but may also be incorporated between the ring segments.

According to an embodiment, actuation of the expander causes the expander to enter into a changed interaction with the expanding ring, so that the expanding ring has a larger radius than prior to actuation of the expander. This process is termed spreading.

One configuration provides that the expanding ring is spread by counterpressure of the expanding element of the expander against the guide lug of the expander. Moving the expanding element close to the guide lug may bring about sufficient spreading of the expanding ring.

According to an embodiment, the body coil is mechanically supported on the expanding ring by pressure of the ram of the support element against the outer wall of the body coil in the direction of the center of the tunnel-shaped magnetic opening. In one embodiment, the ram of the support element may be connected to a body coil counterpart provided for that purpose.

An embodiment provides that the body coil is mechanically supported on the expanding ring by being seated on the point of support of the bottom support device. For example, the body coil may be mechanically supported by providing that the body coil is simultaneously seated on the point of support and is supported by support elements.

DETAILED DESCRIPTION

Figure 1:
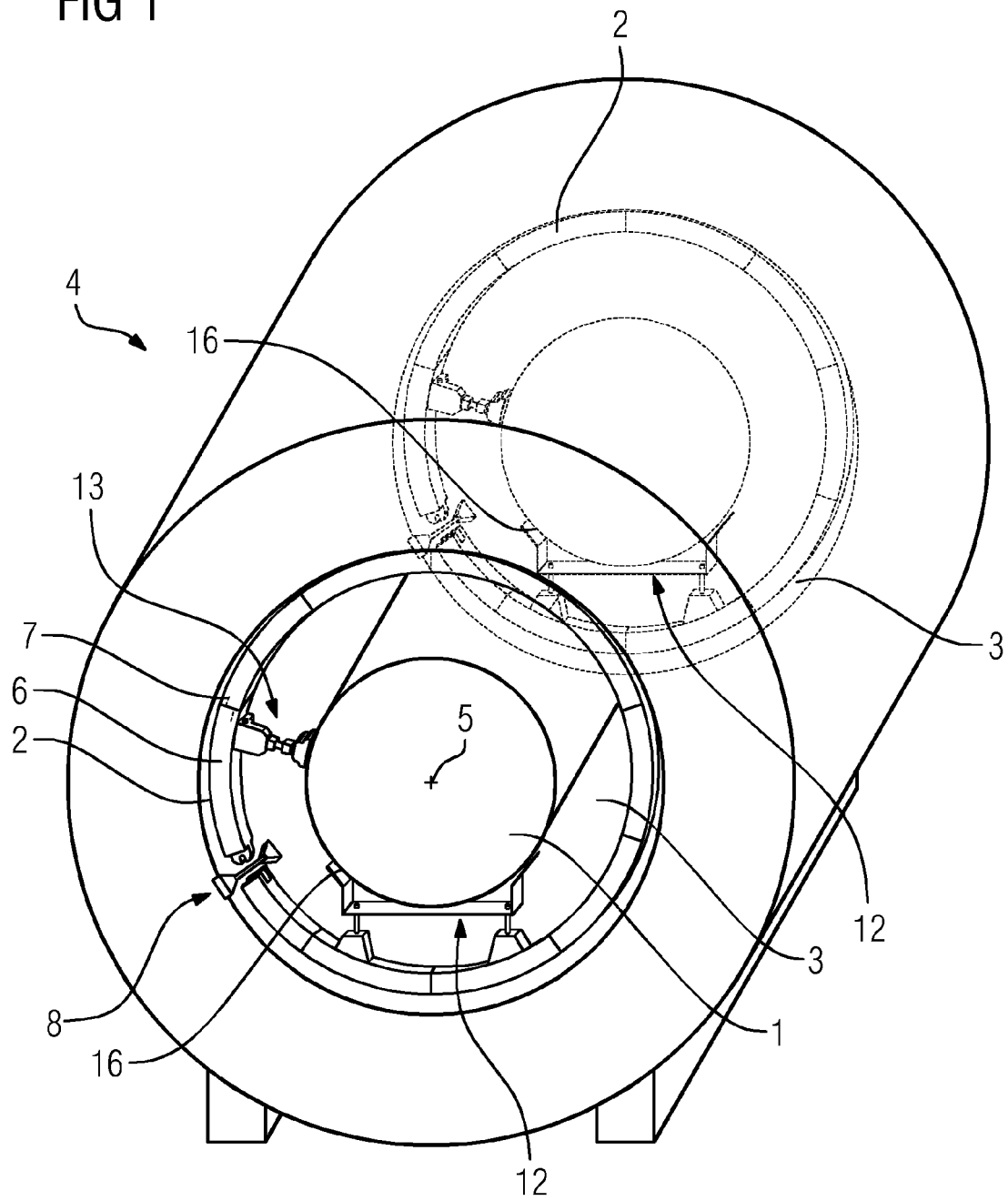
FIG. 1 shows one embodiment of a mounting device for a body coil of a magnetic resonance device.

FIG. 1 shows one embodiment of a mounting device 2,8,12,13 for a body coil 1 of a magnetic resonance device 4. The mounting device 2,8,12,13 shown has two expanding rings 2 that, by spreading out, are attached in a longitudinal direction at both ends of a tunnel-shaped magnetic opening 3 of the magnetic resonance device 4. In this view, the expanding rings 2 include a plurality of ring segments 6 that are interconnected at the connection points by pinned connections 7. An expander 8 is incorporated in a ring segment 6 of the expanding ring 2 shown. On each expanding ring 2, FIG. 1 also shows a bottom support device 12 having two points of support 16 for the body coil 1 in each case. FIG. 1 also shows a support element 13 pointing from the inside of the tunnel-shaped magnetic opening 3 in the direction of the center 5 of the tunnel-shaped magnetic opening 3.

The expanding rings 2 adhere to the inside of the tunnel-shaped magnetic opening 3 of the magnetic resonance device 4 due to static friction. Alternatively, the expanding rings 2 may also be mounted on the inside of a gradient coil system of the magnetic resonance device 4. However, mounting on the inside of the tunnel-shaped magnetic opening 3 is advantageous in that the expanding rings 2 and the body coil 1 attached to the expanding rings 2 are then decoupled from the mechanical vibration of the gradient coil system.

Depending on requirements and application, the mounting device 2,8,12,13 for a body coil 1 may also have only one or more than two expanding rings 2. If the mounting device 2,8,12,13 has only a single expanding ring 2, an additional mount for the body coil 1 may be provided. The expanding rings 2 may also be positioned at any points along the longitudinal axis defined by the tunnel-shaped magnetic opening 3. For reasons of stability, it is advantageous for the expanding rings 2 to be positioned as shown.

The expanding rings 2 may include a different number of ring segments 6 from that shown. The expanding rings 2 may be made up of at least two ring segments 6. The ring segments 6 of the expanding rings 2 may also be supported laterally on existing elements inside the tunnel-shaped magnetic opening 3 (e.g., with bolts, wedges or the gradient coil system).

The depicted bottom support devices 12 for the body coil 1 allow the weight of the body coil 1 to be supported on the points of support 16 of the bottom support devices 12, thereby enabling the body coil 1 to be stabilized. A bottom support device 12 may also have only one point of support 16 or more points of support 16 than shown. The shape and arrangement of the points of support 16 may then be matched to the outer surface of the body coil 1. Mechanical support of the body coil 1 on the expanding rings 2 may also be provided. This completely obviates the need to use a bottom support device 12.

The body coil 1 may also be mechanically supported on the expanding rings 2 using support elements 13. The figure shows a combination of a bottom support device 12 and one support element 13 per expanding ring 2 for mechanically supporting the body coil 1 on the expanding rings 2. However, it is advantageous to use more than one support element 13 per expanding ring 2.

Figure 2:
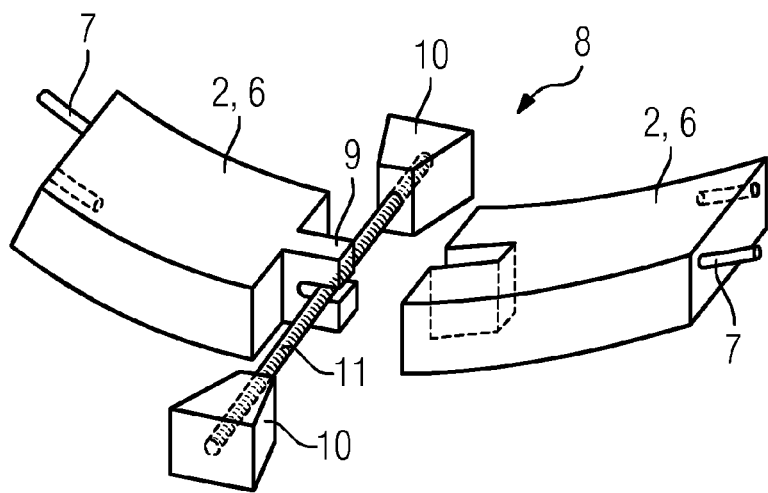
FIG. 2 shows one embodiment of an expander of a mounting device.

FIG. 2 shows one embodiment of an expander 8 of a mounting device 2,8,12,13 for a body coil 1 of a magnetic resonance device 4. The expander has a guide lug 9 incorporated in a ring segment 6 of the expanding ring 2. The expander also includes two expanding elements 10 positioned on opposite sides of the guide lug 9. The expanding elements 10 are interconnected via a connecting element 11. FIG. 2 also shows the pinned connections 7 that interconnect the ring segments 6 of the expanding ring 2.

As shown in the figure, the connecting element 11 may be implemented as a screw. The expanding elements 10 may be wedges. The wedges may have a smaller cross-section on the side facing the guide lug 9 than on the side facing away from the guide lug 9. By tightening the screw, the distance between the two wedges is reduced, and the wedges may press laterally against the guide lug 9. As a result, the two parts of the ring segment 6 of the expanding ring 2 that are separated by the guide lug 9 are forced apart. The expanding ring 2 increases in diameter and is pressed against the inside of the tunnel-shaped magnetic opening 3 of the magnetic resonance device 4. The expanding ring 2 is retained on the inside of the tunnel-shaped magnetic opening 3 by static friction.

At least one expander 8 is used for each expanding ring 2. In one embodiment, two expanders 8 are implemented on diametrically opposed points on the expanding ring 2. Three expanders 8 that may be disposed radially at three equidistant points on the expanding ring 2 may also be used. Any number of expanders 8 for each expanding ring 2 may be provided.

Unlike as shown in FIG. 2, the expander 8 may not be an integral part of the expanding ring 2. The expander 8 may also be incorporated in the expanding ring 2 between two ring segments 6 of the expanding ring 2. The expander 8 may also be removed after the spreading process and replaced by a locking element that keeps the expanding ring 2 in the spread state.

The depicted ring segment 6 of the expanding ring 2 has pinned connections 7 to the adjacent ring segments 6 at both ends. The pinned connections 7 shown each have a way (e.g., a drilled hole) for receiving a connecting pin, and a connecting pin. The pinned connection 7 between two ring segments 6 of the expanding ring may also be implemented using a different number of drilled holes and connecting pins.

Figure 3:
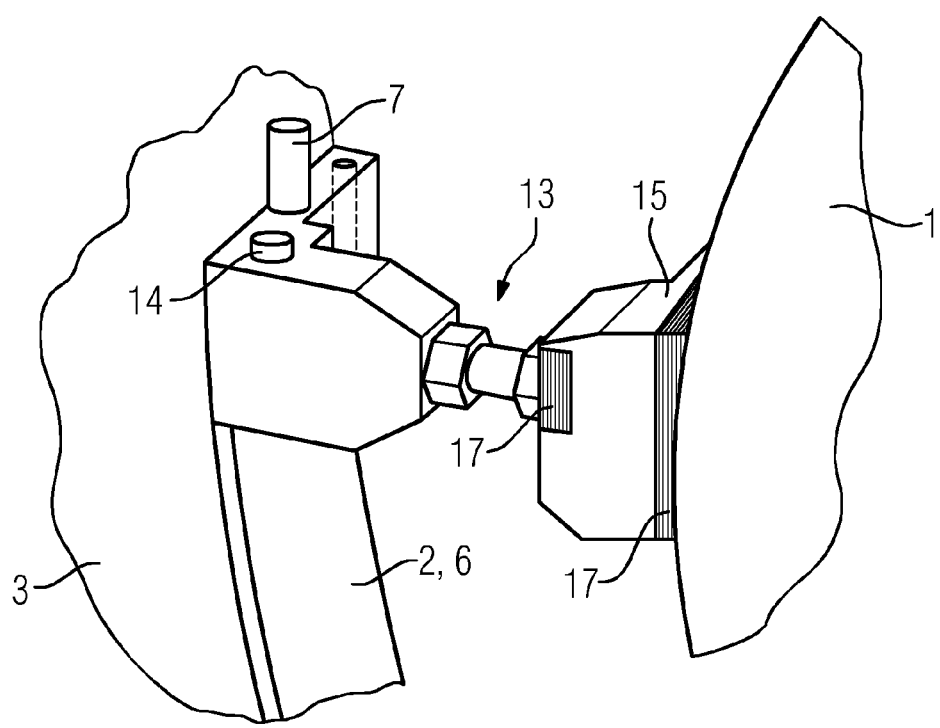
FIG. 3 shows one embodiment of a support element of a mounting device.

FIG. 3 shows one embodiment of a support element 13 of a mounting device 2,8,12,13 for a body coil 1. On the end facing the inside of the tunnel-shaped magnetic opening 3, the support element 13 has a mount 14 that connects the support element 13 to a ring segment 6 of the expanding ring 2. On the end facing in the direction of the center 5 of the tunnel-shaped magnetic opening 3, the support element 13 has a radially adjustable ram 15 for mechanically fixing the body coil 1 in place. A damper 17 is implemented between mount 14 and ram 15.

In the case shown, the mount 14 for mechanically connecting the support element 13 to the expanding ring 2 is implemented such that the support element 13 is incorporated into the expanding ring 2 between two ring segments 6. Alternatively, the support element 13 may also be clamped or bolted to the expanding ring 2.

In the case shown, the position of the ram 15 is adjusted by a set screw that is installed between the mount 14 and the damper 17. The ram 15 is continuously adjustable in the radial direction. The tightening torque of the set screw may also be controlled so that the ram 15 presses against the outer surface of the body coil 1 with a defined force.

The damper 17 shown includes two matched spring elements. In the case shown, the contact surface between the support element 13 and the outer surface of the body coil 1 is deformable. The contact surface may also be of rigid design depending on the desired application.

Such a support element 13 in combination with a bottom support device 12 may be used for mechanically supporting the body coil 1 in the expanding ring 2. More than one support element 13 may also be used. It is advantageous to use at least three (e.g., four support elements 13) that may be mounted at equidistant points on the expanding ring 2.

The present embodiments relate to a mounting device 2,8,12,13 for a body coil 1 of a magnetic resonance device 4, a magnetic resonance device 4 having such a mounting device 2,8,12,13, a coil element having such a mounting device 2,8,12,13, and a method for mounting a body coil 1 of a magnetic resonance device 4

A reversible and universal mounting device 2,8,12,13 for a body coil 1 in a magnetic resonance device 4 is specified. For this purpose, the mounting device 2,8,12,13 includes at least one expanding ring 2 for retaining the body coil 1 in a tunnel-shaped magnetic opening 3 of the magnetic resonance device 4. The mounting device 2,8,12,13 also includes at least one expander 8 configured to enable the expanding ring 2 to be mounted on the inside of the tunnel-shaped magnetic opening 3 of the magnetic resonance device 4 by spreading. The mounting device 2,8,12,13 includes at least one mounting element 12,13 for mechanically supporting the body coil 1 on the expanding ring 2.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A mounting device for a body coil of a magnetic resonance device, the mounting device comprising:
   an expanding ring operable to retain the body coil in a tunnel-shaped magnetic opening of the magnetic resonance device;
   an expander configured to enable the expanding ring to be mounted on the inside of the tunnel-shaped magnetic opening of the magnetic resonance device by spreading; and a mounting element operable to mechanically support the body coil on the expanding ring.

2. The mounting device of claim 1, wherein the expanding ring is at least partly plastic.

3. The mounting device of claim 1, wherein the expanding ring comprises at least two ring segments.

4. The mounting device of claim 3, wherein the at least two ring segments are interconnectable by pinned connections.

5. The mounting device of claim 1, wherein the expander in an initial state is configured such that the expanding ring has a first radius, and
wherein the expander in a second state is configured such that the expander enters into a changed interaction with the expanding ring, and the expanding ring has an enlarged second radius compared to the first radius.

6. The mounting device of claim 1, wherein the expander comprises:
a guide lug that is incorporated in the expanding ring,
an expanding element and a connecting element interacting therewith,
wherein the expanding element and the connecting element enable the expanding element to be displaced relative to the guide lug.

7. The mounting device of claim 1, wherein the mounting element is implemented as a support element,
wherein on an end facing the inside of the tunnel-shaped magnetic opening, the support element comprises a mount that is configured to provide mechanical connection of the support element to the expanding ring, and
wherein on an end facing in the direction of a center of the tunnel-shaped magnetic opening, the support element comprises a radially adjustable ram for mechanically fixing the body coil in place.

8. The mounting device of claim 7, wherein the support element comprises an adjustable damper between the mount and the ram.

9. The mounting device of claim 1, wherein the mounting element is implemented as a bottom support device for the body coil, and
wherein the bottom support device is provided for a mechanical connection to the expanding ring and comprises at least one point of support for the body coil.

10. A magnetic resonance device comprising:
a mounting device for a body coil of the magnetic resonance device, the mounting device comprising:
an expanding ring operable to retain the body coil in a tunnel-shaped magnetic opening of the magnetic resonance device;
an expander configured to enable the expanding ring to be mounted on the inside of the tunnel-shaped magnetic opening of the magnetic resonance device by spreading; and
a mounting element operable to mechanically support the body coil on the expanding ring.

11. A coil element comprising:
a mounting device for a body coil of a magnetic resonance device, the mounting device comprising:
an expanding ring operable to retain the body coil in a tunnel-shaped magnetic opening of the magnetic resonance device;
an expander configured to enable the expanding ring to be mounted on the inside of the tunnel-shaped magnetic opening of the magnetic resonance device by spreading; and
a mounting element operable to mechanically support the body coil on the expanding ring; and
the body coil, wherein the body coil is mechanically connectable to the mounting device via the mounting element.

12. A method for mounting a body coil in a magnetic resonance device, the method comprising:
mounting the body coil on an inside of a tunnel-shaped magnetic opening of the magnetic resonance device, the mounting of the body coil comprising spreading an expanding ring with an expander such that the expanding ring is mounted on the inside of the tunnel-shaped magnetic opening of the magnetic resonance device,
wherein the body coil is mechanically supported on the expanding ring by a mounting element.

13. The method of claim 12, wherein, by actuation of the expander, the expander enters into a changed interaction with the expanding ring so that the expanding ring has a larger radius than prior to actuation of the expander.

14. The method of claim 13, wherein the expanding ring is spread by counterpressure of an expanding element of the expander against a guide lug of the expander.

15. The method of claim 12, wherein the expanding ring is spread by counterpressure of an expanding element of the expander against a guide lug of the expander.

16. The method of claim 15, wherein the body coil is mechanically supported on the expanding ring by pressure of a ram of a support element against an outer wall of the body coil in the direction of the center of the tunnel-shaped magnetic opening.

17. The method of claim 15, wherein the body coil is mechanically supported on the expanding ring by being seated on a point of support of a bottom support device.

18. The method of claim 12, wherein the body coil is mechanically supported on the expanding ring by pressure of a ram of a support element against an outer wall of the body coil in the direction of the center of the tunnel-shaped magnetic opening.

19. The method of claim 18, wherein the body coil is mechanically supported on the expanding ring by being seated on a point of support of a bottom support device.

20. The method of claim 12, wherein the body coil is mechanically supported on the expanding ring by being seated on a point of support of a bottom support device.

* * * * *